(12) United States Patent
Alam et al.

(10) Patent No.: US 7,358,616 B2
(45) Date of Patent: Apr. 15, 2008

(54) SEMICONDUCTOR STACKED DIE/WAFER CONFIGURATION AND PACKAGING AND METHOD THEREOF

(75) Inventors: Syed M. Alam, Austin, TX (US); Robert E. Jones, Austin, TX (US); Scott K. Pozder, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 27 days.

(21) Appl. No.: 11/226,025

(22) Filed: Sep. 14, 2005

(65) Prior Publication Data

US 2007/0057384 A1 Mar. 15, 2007

(51) Int. Cl.
*H01L 23/48* (2006.01)
(52) U.S. Cl. ............ 257/783; 257/782; 257/784; 257/786; 257/686; 257/723; 257/621; 257/620; 257/777; 257/E25.013; 257/E23.018
(58) Field of Classification Search ........ 257/782–784, 257/786, 686, 723, 621, 620, 777, E25.013, 257/E23.018
See application file for complete search history.

(56) References Cited

U.S. PATENT DOCUMENTS

| | | | |
|---|---|---|---|
| 6,624,046 B1 | 9/2003 | Zavracky et al. | |
| 6,642,081 B1 * | 11/2003 | Patti | 438/109 |
| 2005/0031291 A1 | 2/2005 | Gao et al. | |
| 2005/0079721 A1 | 4/2005 | Buerger, Jr. et al. | |
| 2005/0167798 A1 * | 8/2005 | Doan | 257/678 |
| 2005/0194674 A1 | 9/2005 | Thomas et al. | |
| 2005/0270055 A1 * | 12/2005 | Akram et al. | 324/765 |
| 2005/0273749 A1 * | 12/2005 | Kirk | 716/16 |

OTHER PUBLICATIONS

Kleiner et al, "Performance Improvement of the Memory Hierarchy of RISC-Systems by Application of 3-D Technology", IEEE Part B, vol. 19, No. 4, Nov. 1996, pp. 709-718.
Black et al, "3D Processing Technology and its Impact on iA32 Microprocessors", IEEE International Conference on Computer Design, 2004.
AMKOR Technology "3D Packaging" Jun. 2004.

* cited by examiner

*Primary Examiner*—Junghwa M. Im
(74) *Attorney, Agent, or Firm*—Susan C. Hill; Robert L. King

(57) ABSTRACT

A reciprocal design symmetry allows stacked wafers or die on wafer to use identical designs or designs that vary only by a few layers (e.g. metal interconnect layers). Flipping or rotating one die or wafer allows the stacked die to have a reciprocal orientation with respect to each other which may be used to decrease the interconnect required between the vertically stacked die and or wafers. Flipping and/or rotating may also be used to improve heat dissipation when wafer and/or die are stacked. The stacked wafers or die may then be packaged.

20 Claims, 12 Drawing Sheets

US 7,358,616 B2

SEMICONDUCTOR STACKED DIE/WAFER CONFIGURATION AND PACKAGING AND METHOD THEREOF

FIELD OF THE INVENTION

The present invention relates to semiconductors, and more particularly, to stacked die/wafer configuration and packaging.

RELATED ART

Vertical integration of die on top of one another with electrical connections directly between the stacked die can result in substantial reduction in die-to-die interconnect lengths compared to side-by-side placement of die on a substrate or even compared to stacked die connected by external wire bonds. However, a number of problems arise when one or more wafers and/or die are stacked one on top of another. Thermal or heat dissipation may be reduced significantly, causing an increase in die temperature, and hence, slower operating speeds, increased leakage power consumption, and potentially reduced reliability. This thermal problem can be exacerbated if two die are vertically integrated with local hot spots that overlie each other. Another problem is that separate designs and reticle sets may be required for each of the die that are vertically integrated thus increasing the cost and manufacturing complexity.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The present invention utilizes reciprocal design symmetry such that vertically integrated die can be fabricated using the same reticle set or substantially the same reticle set. As used here in the term 'reciprocal design symmetry' refers to a design which has the property that a first integrated circuit having such a design layout can be combined with a second integrated circuit of the same (or substantially the same) design layout by rotating or flipping the second integrated circuit and then placing it on top of the first integrated circuit (in its original orientation) such that connection of the adjacent contacts on the surfaces of the first and second integrated circuits completes a desired circuit which included circuit elements of both the first and second integrated circuits. The layouts of both the first and second integrated circuits are then defined to be 'reciprocal circuit layouts' of each other. Furthermore, the second integrated circuit following the rotation or flipping is defined to be in a 'reciprocal orientation' to the first die. A further advantage of the present invention is that it can provide for orientation of the vertically integrated die relative to each other such that local hot spots related to specific sections of the die are not stacked on top of each other.

Figure 1:
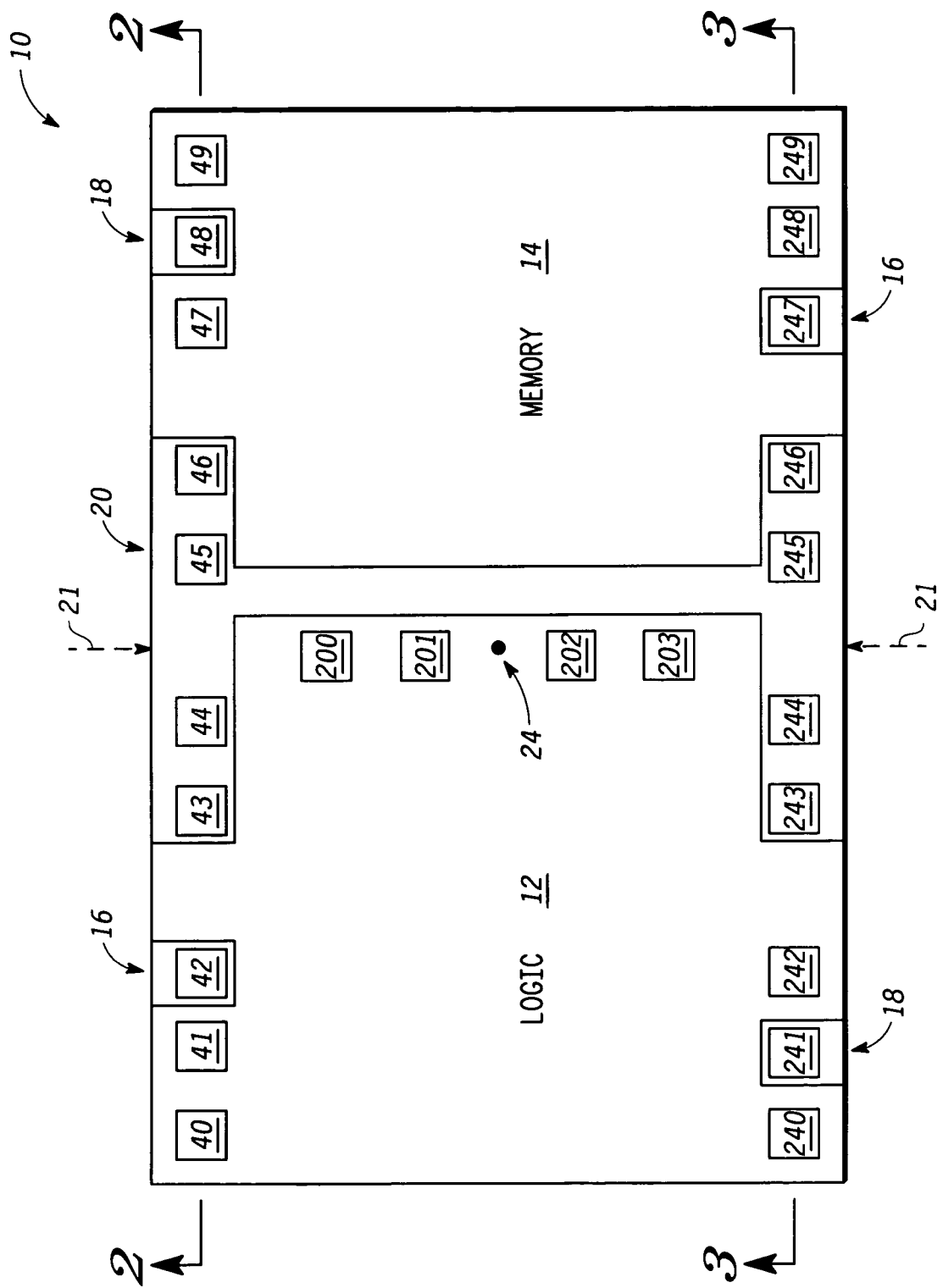
FIG. 1 illustrates, in block diagram form, a top view of an integrated circuit die 10 in accordance with one embodiment of the present invention.

FIG. 1 illustrates, in block diagram form, a top view of an integrated circuit die 10 in accordance with one embodiment of the present invention. In the illustrated embodiment, die 10 comprises logic 12, memory 14, external input/output (I/O) 16 and 18, and interconnect 20. Axis for flipping 21 illustrates a first axis for flipping die 10 in the same manner as is used for flip-chip packaging. External I/O 16 and 18 may be used to couple die 10 to a package (e.g. 11 of FIG. 6, 13 of FIG. 7). In alternate embodiments, none, one, or more of memory 14 and logic 12 may have one or more external I/O 16 and 18. Alternate embodiments of interconnect 20 may have external I/O 16 and 18. In the illustrated embodiment, interconnect 20 may be used for one or more of die to die, wafer to wafer, die to wafer, die to package, and/or wafer to package. Note that the layout of interconnect 20 may have any desired and appropriate shape. In addition, in alternate embodiments, interconnect 20 may be partitioned into multiple portions which are located at any desired locations on the periphery or interior of die 10. Memory 14 may be any type of memory.

Logic 12 may include any type of logic, such as, for example, a core processor. Alternate embodiments of the present invention may use any circuitry for logic 12 and memory 14. For example, memory 14 may merely be any other type of circuitry, including non-memory circuitry. Alternate embodiments of the present invention may use any number of segregated logic 12 and memory 14. For example, die 10 in FIG. 1 may comprise first logic section next to first memory section next to second logic section next to second memory section. Also, any type of processing technology may be used to form one or more of logic 12, memory 14 and other circuitry on die 10, such as, for example, CMOS, NMOS, PMOS, and/or bipolar technology. Die 10 in FIG. 1 has pads 40-49, 200-203, 240-249. Pads 40-49, 200-203, 240-249 may be used for one or more of die to die, wafer to wafer, die to wafer, or die to package connection. In alternate embodiments, die 10 may have any number of pads. Die 10 can also have dummy pads not used for any connection. FIG. 1 shows a second axis of rotation 24 that is orthogonal to the top view of die 10. Using the axis of rotation 24 as center, die 10 can be rotated clockwise or anti-clockwise in the top view plane. Note that the axis of flipping 21 and axis of rotation 24 are situated horizontally and vertically in the top view plane, respectively.

Figure 2:
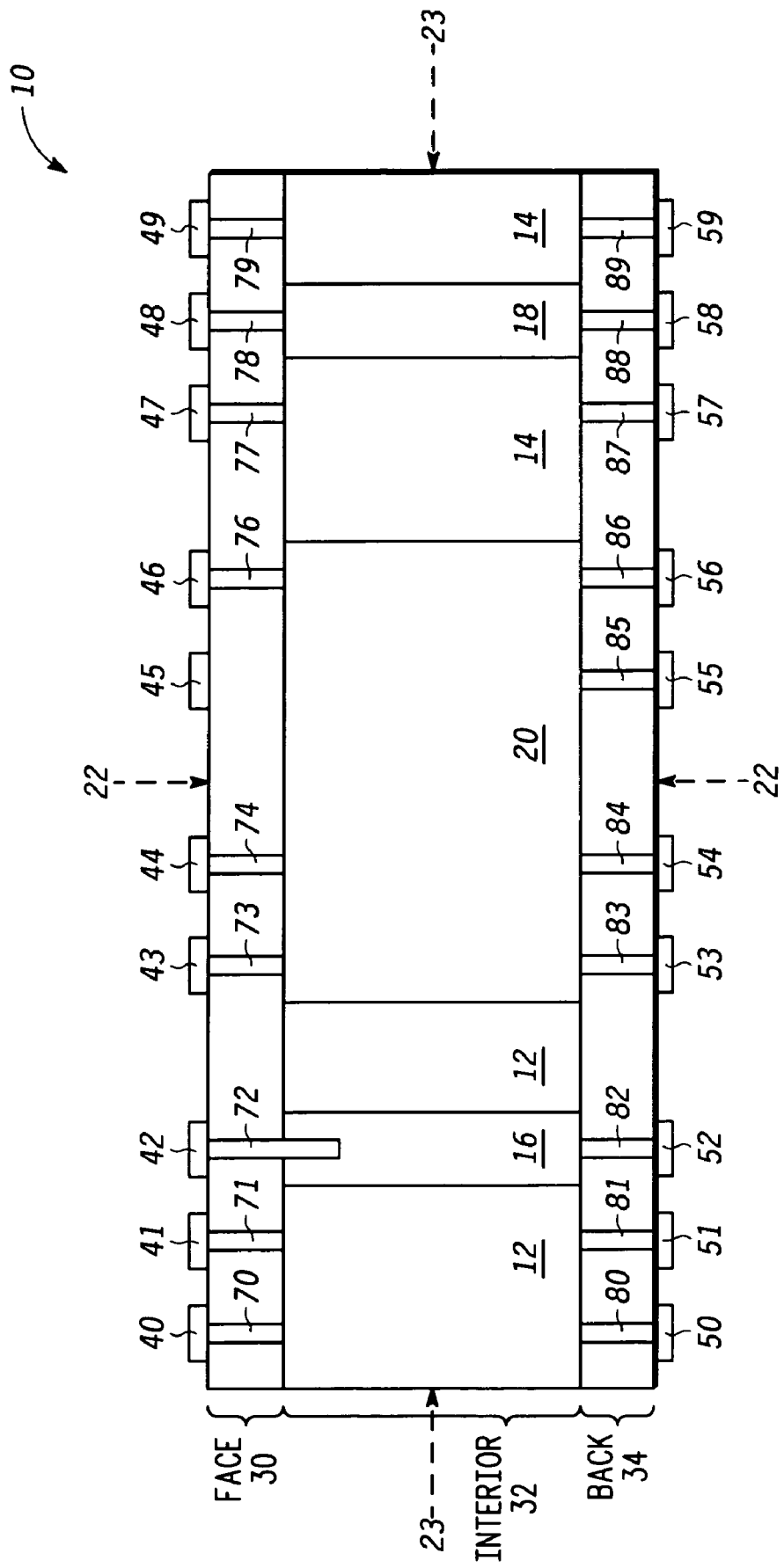
FIG. 2 illustrates, in block diagram form, a cross-sectional view of the integrated circuit die 10 of FIG. 1 in accordance with one embodiment of the present invention.

FIG. 2 illustrates, in block diagram form, a cross-sectional view of the integrated circuit die 10 of FIG. 1 in accordance with one embodiment of the present invention. Referring to FIG. 2, axis of symmetry 22 illustrates a first axis for symmetry for pads 40-49 and 50-59. Note that axis 22 is orthogonal to axis 21 (see FIG. 1). Axis of symmetry 23 illustrates a second axis for symmetry for pads 40-49 and 50-59. Die 10 comprises a face 30, overlying an interior 32, which then overlies back 34. In the illustrated embodiment, interior 32 comprises transistors and other circuitry which may be used as part of circuits 12, 14, 16, 18, and 20. As used herein, the term "face" of a die refers to the surface of the die which is closest to most of the transistor elements of the die. The term "back" of a die refers to the surface of the die which is closest to a bulk or substrate of the die. In some forms transistors may be implemented through both the face and the back of the die, but the majority of transistor devices are positioned closest to the face rather than the back. It is understood that these definitions for face and back are for the die following the formation of the transistor elements prior to any wafer thinning. The surfaces retain these definitions even in the case where substantial die thinning during vertical integration brings the back surface nearer the transistor elements than the face surface is from the transistor elements.

In the illustrated embodiment, face 30 is a layer which comprises interconnect structures 70-74 and 76-79 which are used to electrically couple pads 40-44 and 46-49, respectively. Note that pad 45 is not electrically coupled to interior 32 and thus serves as a mechanical attach point. In the illustrated embodiment, back 34 is a layer which comprises interconnect structures 80-89 which are used to electrically couple pads 50-59, respectively. Note that if back 34 is formed on the backside of a wafer or die, interconnect structures 80-89 may be formed in any desired and known manner, such as, for example, etching into the backside of the wafer or die, or grinding down the backside of the wafer or die to reach preformed or embedded structures 80-89.

Figure 3:
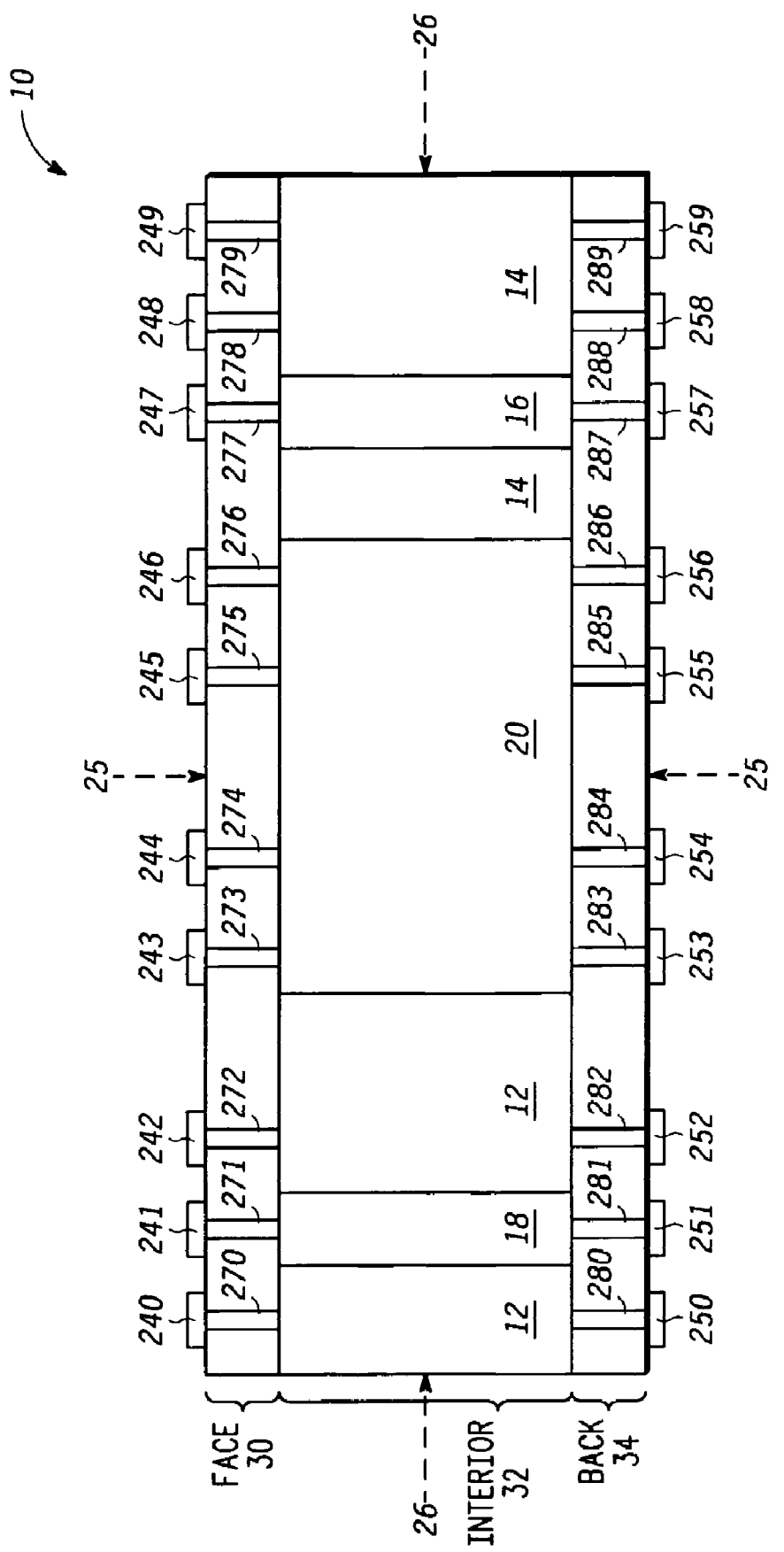
FIG. 3 illustrates, in block diagram form, a second cross-sectional view of the integrated circuit die 10 of FIG. 1 in accordance with one embodiment of the present invention.

FIG. 3 illustrates, in block diagram form, a second cross-sectional view of the integrated circuit die 10 of FIG. 1 in accordance with one embodiment of the present invention. Referring to FIG. 3, axis of symmetry 25 illustrates a first axis for symmetry for pads 240-249 and 250-259. Note that axis 25 is orthogonal to axis 21 (see FIG. 1). Axis of symmetry 26 illustrates a second axis for symmetry for pads 240-249 and 250-259. In the illustrated embodiment, face 30 is a layer which comprises interconnect structures 270-279 which are used to electrically couple pads 240-249, respectively. In the illustrated embodiment, back 34 is a layer which comprises interconnect structures 280-289 which are used to electrically couple pads 250-259, respectively.

Figure 4:
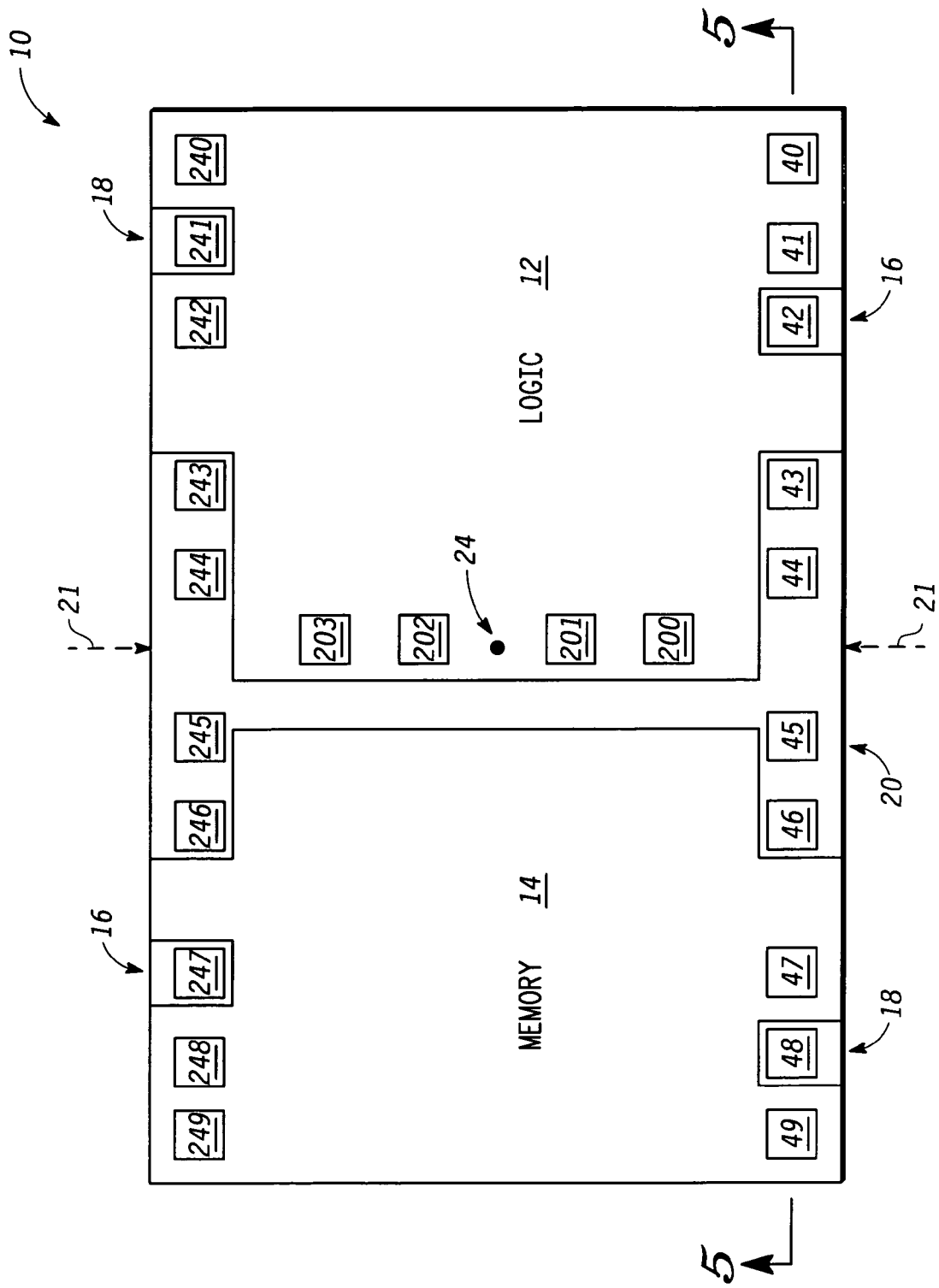
FIG. 4 illustrates, in block diagram form, a top view of an integrated circuit die 10 of FIG. 1 which has been rotated 180 degrees in accordance with one embodiment of the present invention.

FIG. 4 illustrates, in block diagram form, a top view of an integrated circuit die 10 of FIG. 1 which has been rotated 180 degrees about vertical axis 24 in FIG. 1 in accordance with one embodiment of the present invention. Other than the fact that die 10 of FIG. 1 has been physically rotated after manufacture, the description above for die 10 of FIG. 1 still applies to die 10 of FIG. 4.

However, note that in the illustrated embodiment, at least one portion of interconnect 20 of die 10 of FIG. 1 will overlie at least one portion of interconnect 20 of die 10 of FIG. 4 if the two die are stacked. Note that FIGS. 12-15 illustrate various ways of stacking die 10 (see die 142 of FIG. 12, die 146 of FIG. 13, die 150 of FIG. 14, and die 154 of FIG. 15). Interconnect 20 may be physically laid out and located on die 10 in such a way that overlap between stacked die 10 is achieved in one or more of the ways in which multiple die are stacked (see die 142, 146, 150, and 154 in FIGS. 12-15).

Figure 5:
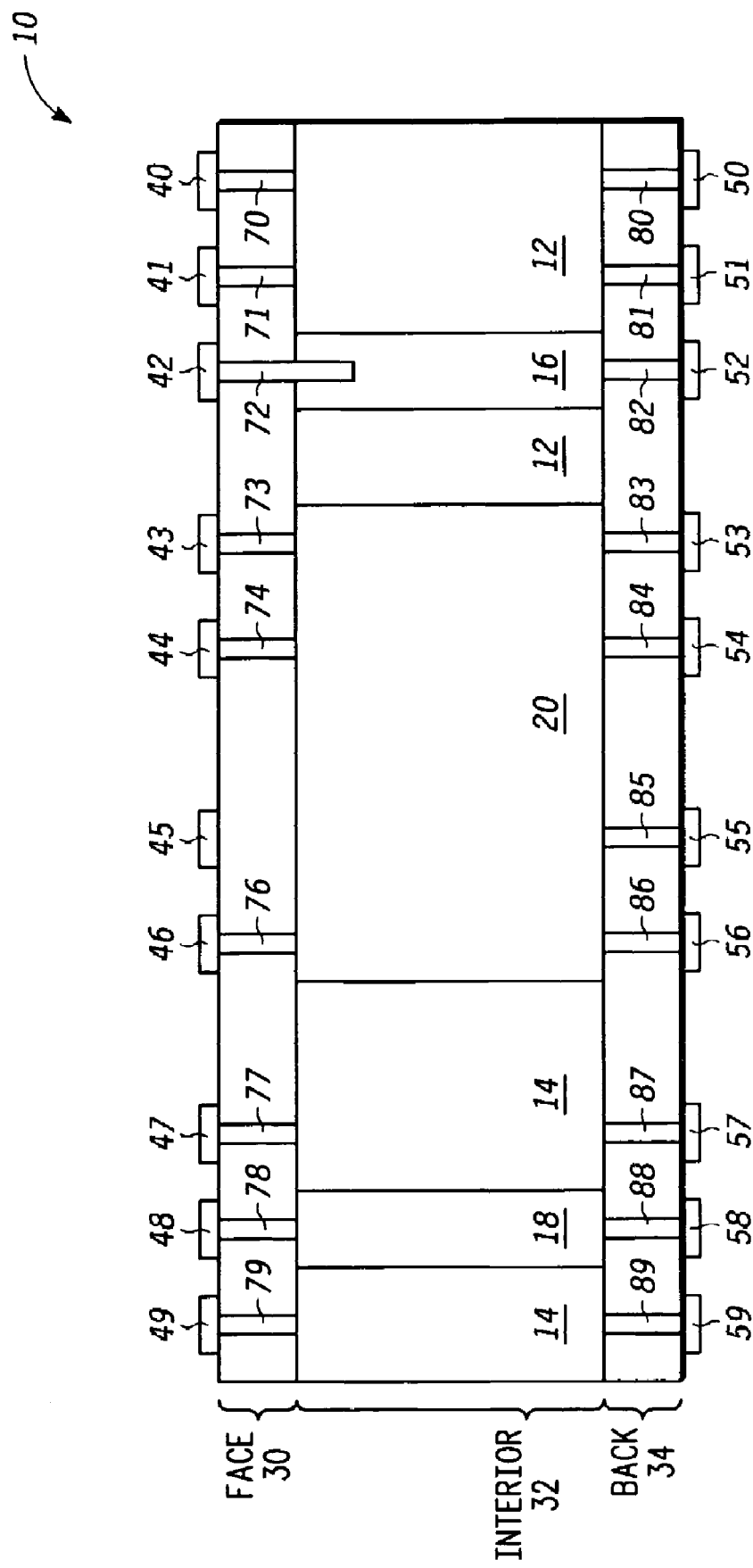
FIG. 5 illustrates, in block diagram form, a cross-sectional view of the integrated circuit die 10 of FIG. 4 in accordance with one embodiment of the present invention.

FIG. 5 illustrates, in block diagram form, a cross-sectional view of an integrated circuit die 10 of FIG. 1 which has been rotated 180 degrees in accordance with one embodiment of the present invention. Note the 180 degree rotation was performed about axis 24 (see FIG. 1) after manufacture of die 10. Other than the fact that die 10 of FIG. 1 has been physically rotated after manufacture, the description above for die 10 of FIG. 1 still applies to die 10 of FIG. 5 Note that the cross-section of die 10 illustrated in FIG. 5 is an inverted image of the cross-section of die 10 illustrated in FIG. 2.

Figure 6:
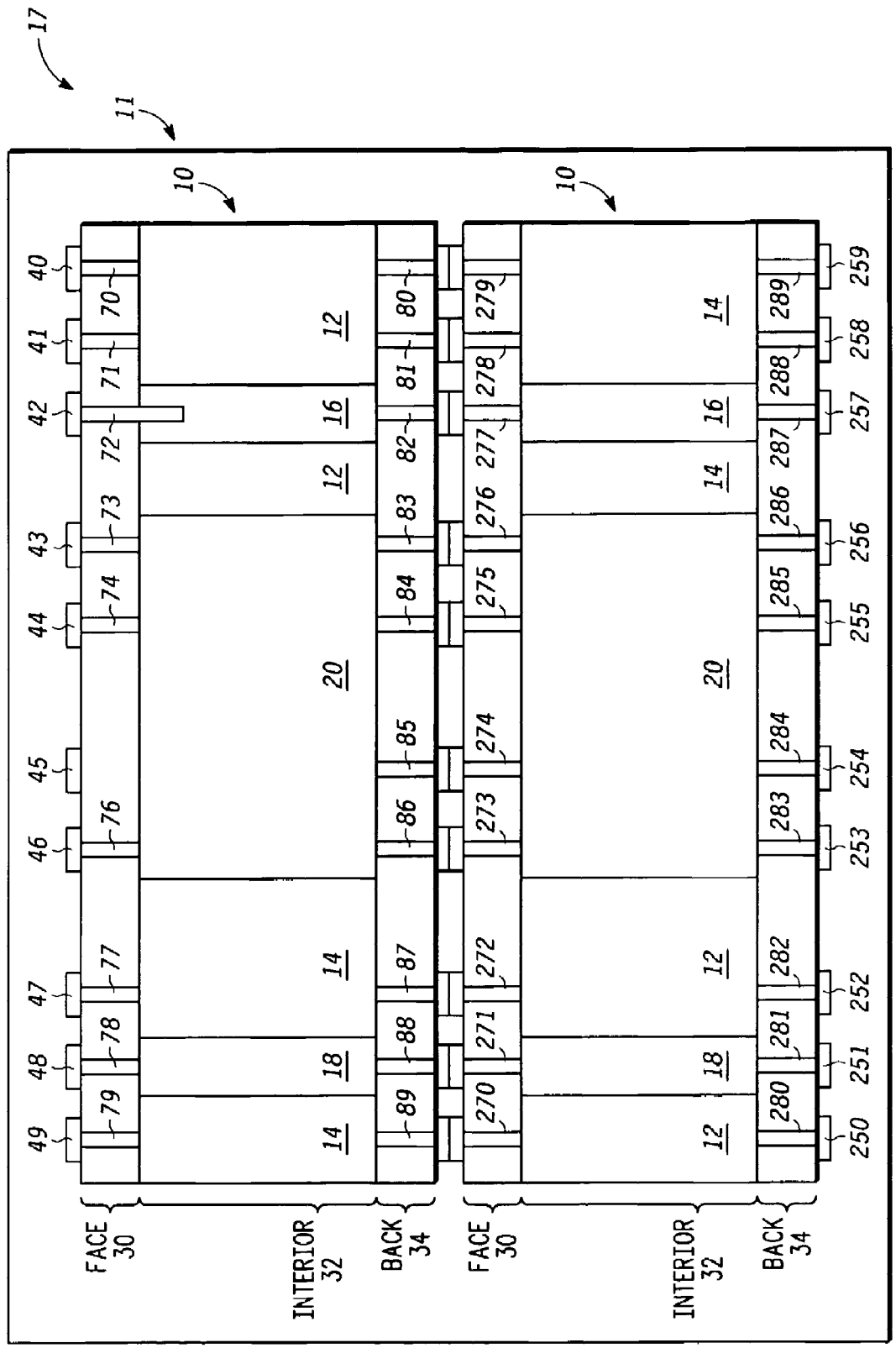
FIG. 6 illustrates, in block diagram form, a cross-sectional view of a first integrated circuit die 10 of FIG. 3 and a second integrated circuit die 10 of FIG. 5 in accordance with one embodiment of the present invention.
Figure 10:
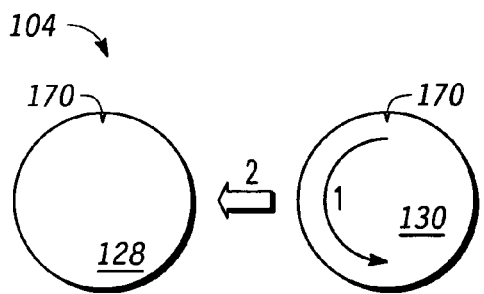
Figure 14:
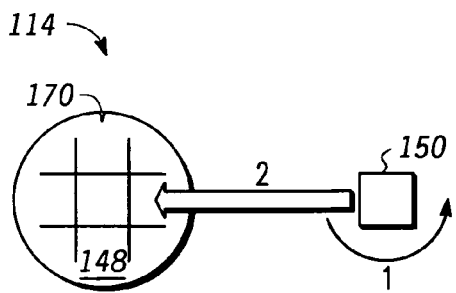

FIG. 6 illustrates, in block diagram form, a cross-sectional view of a first integrated circuit die 10 of FIG. 3 and a second integrated circuit die 10 of FIG. 5 in accordance with one embodiment of the present invention. The vertically integrated die are placed in package 11. Note that the packaged device 17 makes use of the stacking methods illustrated in FIGS. 10 and 14. Thus the bottom die 10 is oriented the same as die 10 of FIGS. 1 and 3. However, the top die 10 has been rotated 180 degrees as illustrated in FIGS. 10 and 14. Thus, the top die 10 is oriented the same as die 10 of FIGS. 4 and 5. Note that face to back bonding may be used to bond the face 30 of the bottom die 10 to the back 34 of the top die 10. Pads 240-249 on bottom die 10 are electrically coupled and/or physically connected to pads 59-50, respectively on the top die 10. In this invention the circuit design of die 10 has a reciprocal design symmetry such that the rotated top die 10 and the bottom die 10 in its original orientation form the desired completed circuit.

Note that by rotating the top die 10 of FIG. 6 by 180 degrees, the memory 14 of the top die 10 is oriented closer to the logic 12 of the bottom die, and the logic 12 of the top die 10 is oriented closer to the memory 14 of the bottom die. The fact that the memory 14 and logic 12 of the top and bottom die 10 are now closer (due to the rotation), has the advantage of decreasing the length of the interconnect structures (e.g. 270-279, 89-80) between the bottom die 10 and the top die 10 in comparison with other multi-die packages. Further the interconnect distances between the memory 14 of the top die and the logic 12 of the bottom die are minimized, as is the interconnect length between the memory 14 of the bottom die and the logic 12 of the top die. A further advantage of placing the memory and logic vertically adjacent is the reduction of hot spots since the memory typically generates less heat than the logic. In addition, for some embodiments, external I/O 18 and 16 on the top die 10 may be used as input/output for bottom die 10 by way of the interconnect structure (e.g. 88). Conversely, external I/O 18 and 16 on the bottom die 10 may be used as input/output for top die 10 by way of the interconnect structure (e.g. 271). It may also be advantageous to use a plurality of discontinuous portions of interconnect 20 located both at the periphery and interior of the die 10 in order to minimize the length of interconnect required horizontally across the die 10 in face 30 and back 34.

Figure 7:
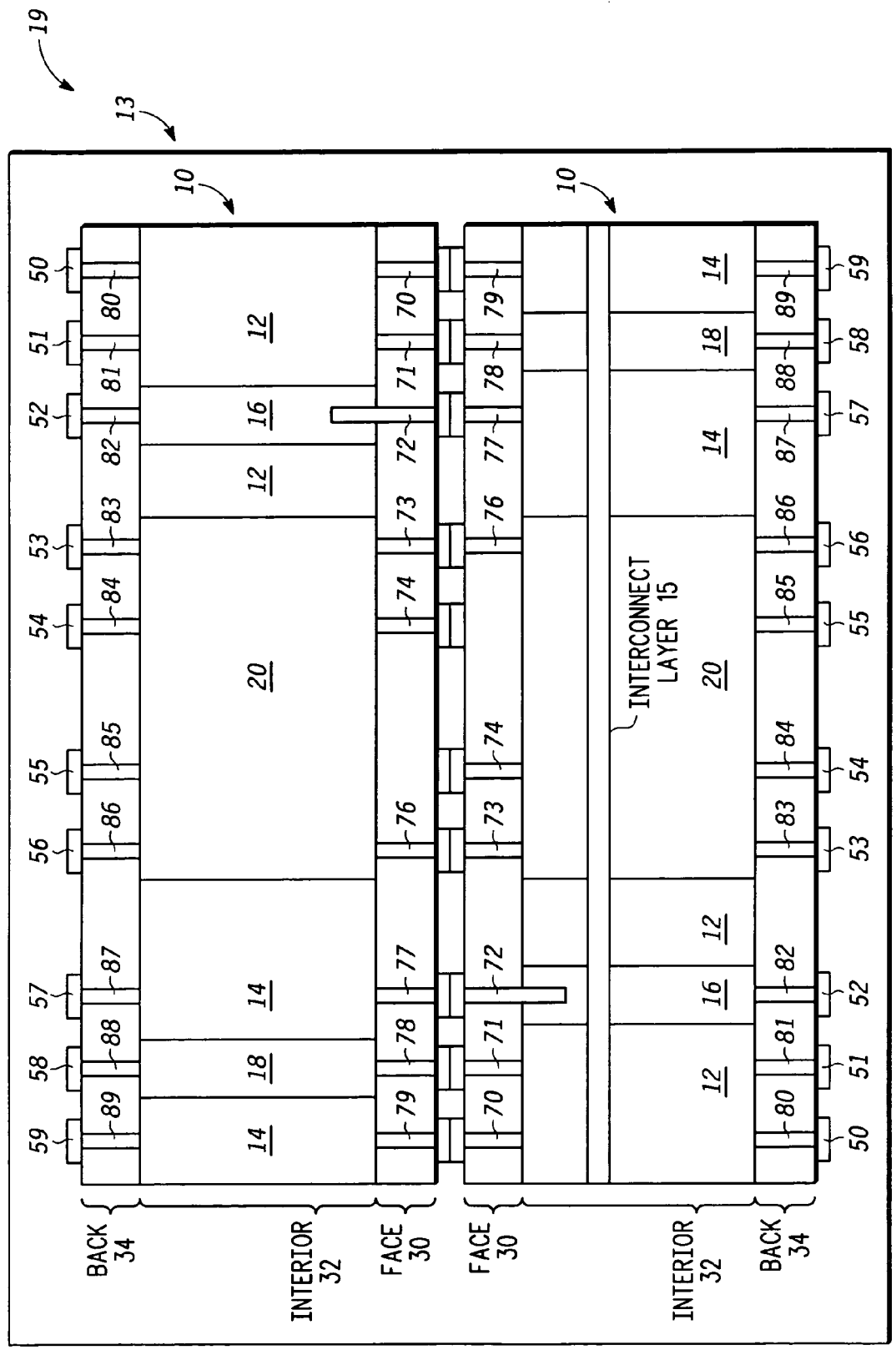
FIG. 7 illustrates, in block diagram form, a cross-sectional view of an integrated circuit die 10 of FIG. 2 and an integrated circuit die 10 of FIG. 2 which has been flipped 180 degrees in accordance with one embodiment of the present invention.
Figure 8:
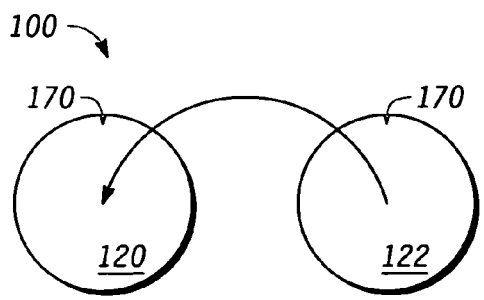
FIGS. 8-15 illustrate, in block diagram form, top views of integrated circuit wafers and die in various orientations in accordance with a plurality of embodiments of the present invention.
Figure 12:
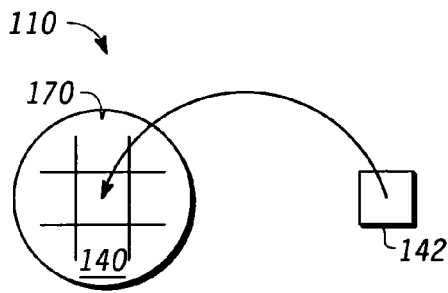

FIG. 7 illustrates, in block diagram form, a cross-sectional view of a first integrated circuit die 10 of FIG. 2 and a second integrated circuit die 10 of FIG. 2 which has been flipped 180 degrees about the axis 21 shown in FIG. 1 in accordance with one embodiment of the present invention. The vertically integrated die are placed in package 13. Note that the packaged device 19 makes use of the stacking methods illustrated in FIGS. 8 and 12. Thus the bottom die 10 is oriented the same as die 10 of FIGS. 1, 2 and 3. However, the top die 10 has been flipped (without rotation) as illustrated in FIGS. 8 and 12. Thus, the top die 10 is oriented the same as die 10 of FIGS. 1, 2 and 3 after they have been flipped. Note that face to face bonding may be used to bond the face 30 of the bottom die 10 to the face 30 of the top die 10. Pads 40-49 on bottom die 10 are electrically coupled and/or physically connected to pads 49-40, respectively, on the top die 10. Note that pad 45 on bottom die 10 and pad 45 on top die 10 are only used for physical connection and mechanical support and are not used for electrical connectivity. The design of die 10 in this embodiment has a reciprocal design symmetry such that the flipped top die 10 and the bottom die 10 in its original orientation form the completed circuit. Further more in this embodiment, the die can be designed with memory and logic in separate sections such that the vertically integrated die have the memory and logic sections vertically stacked over each other.

Note that the same mask set or substantially the same mask set is used to form both the top die 10 and the bottom die 10 for the stacked devices 17 and 19 illustrated in FIGS. 6 and 7, respectively. The design of die 10 in the embodiment illustrated in FIG. 6 has a rotational reciprocal design symmetry and the design of die 10 in the embodiment illustrated in FIG. 7 has a flip reciprocal design symmetry such that the flipped top die 10, respectively, and the bottom die 10 in its original orientation form the completed circuit. This results in great efficiency since only one mask set is required for a plurality of die used in a stacked design.

Note that the interconnect structures, for simplicity, have been illustrated throughout the figures as terminating at the interface with the interior 32, with the exception of interconnect structure 72. Alternate embodiments may have one or more of interconnect structures 70-74, 76-79, 80-89, 270-279, 280-289 which are electrically coupled to any desired layer within interior 32. Alternate embodiments also may enjoy a process simplification for one of the die 10 by not forming the interconnect structures in the back layer 34 nor the electrically coupled pads. This would only be done for one of the die and only for a back layer which is an exterior surface of the vertically integrated pair of die. For example, one embodiment would be similar to the cross-section shown in FIG. 6, except the interconnect structures 280-289 and pads 250-259 would not be present. In another example, an embodiment would be represented by the cross-section of FIG. 7 with interconnect structures 89-80 and pads 59-50 of the top die omitted. Alternatively, another embodiment could have the interconnect structures 80-89 and pads 50-59 of the bottom die omitted. Further it will be recognized by those skilled in the art that the boundary between the face 30 and the interior 32 need not be planar as illustrated in FIGS. 2, 3, 5, 6, and 7.

Note that devices 17 and 19 of FIGS. 6 and 7 can be packaged in any desired manner. For example, flip-chip BGA (ball grid array), wire-bond BGA, lead-frame packages (e.g. QFP (quad flat package), QFN (quad flat no-lead)), DIP (dual inline package). The interconnections between one or more of available pads (e.g. 40-49, 250-259 in FIG. 6) can be performed in any desired or standard manner as required by the package type. For example, a redistribution layer may be interposed between pads 40-49, 250-259 and the package. Alternately, ball attach, pin attach, or wire attach may be used. Also, the pads 40-49, 250-259 may be formed of any desired material and may be any desired shape.

Although the embodiments illustrated in FIGS. 6 and 7 illustrate two stacked die, alternate embodiments may use any number of stacked die. For example, a die 10 oriented as illustrated in FIG. 3 may be stacked on top of the top die 10 illustrated in FIG. 6, or alternately a die 10 orientated as illustrated in FIG. 2 may be stacked on top of the top die illustrated in FIG. 7. The design of the die 10 would need to take into account the required additional reciprocal symmetry.

FIGS. 8-15 illustrate, in block diagram form, top views of integrated circuit wafers and die in various orientations in accordance with a plurality of embodiments of the present invention. Notch 170 is used to orient the wafer. FIGS. 8-11 illustrate methods for stacking a plurality of wafers. FIGS. 12-15 illustrate methods for stacking a die on a wafer. Die on wafer may be used for a variety of purposes. One such purpose is to stack known good die on top of known good die for situations where the yield of known good die is not sufficiently high to use wafer to wafer stacking. Note that FIGS. 6 and 7 illustrate methods for stacking a die on a die. Alternate embodiments may use appropriate combination of flipping, rotating, non-flipping, and non-rotating to achieve the desired reciprocal orientation between the die being stacked.

Figure 9:
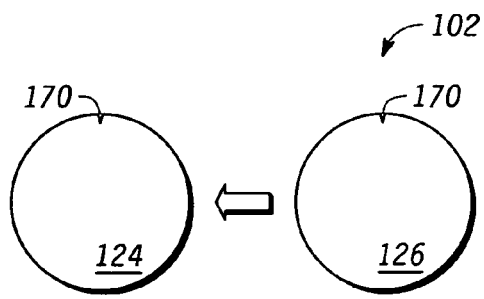
Figure 11:
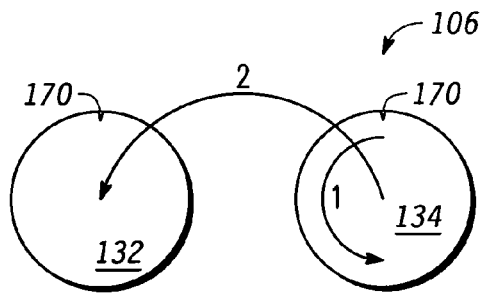

FIG. 8 illustrates a method 100 in which wafer 122 is flipped over and stacked face to face on top of wafer 120. FIG. 9 illustrates a method 102 in which wafer 126 is stacked so that the back of wafer 126 is on top of the face of wafer 124. FIG. 10 illustrates a method 104 in which wafer 130 is first rotated 180 degrees and is then stacked so that the back of wafer 130 is on top of the face of wafer 128. FIG. 11 illustrates a method 106 in which wafer 134 is first rotated 180 degrees and is then flipped over and stacked face to face on top of wafer 132.

Figure 13:
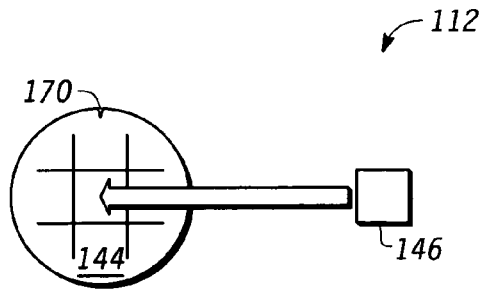
Figure 15:
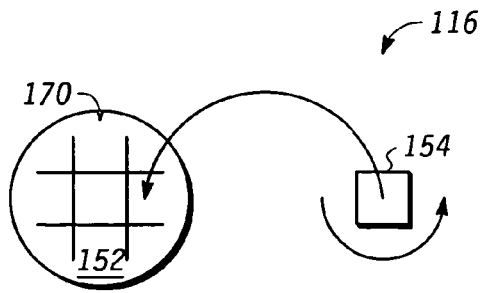

FIG. 12 illustrates a method 110 in which die 142 is flipped over and stacked face to face on top of wafer 140. FIG. 13 illustrates a method 112 in which die 146 is stacked so that the back of die 146 is on top of the face of wafer 144. FIG. 14 illustrates a method 114 in which die 150 is first rotated 180 degrees and is then stacked so that the back of die 150 is on top of the face of wafer 148. FIG. 15 illustrates a method 116 in which die 154 is first rotated 180 degrees and is then flipped over and stacked face to face on top of wafer 152.

Notice that method 106 shown in FIG. 11 results in the same orientation for wafer 134 as flipping 134 about an axis in the plane of the wafer which is orthogonal to the flip axis actually used. A similar situation results for method 116 shown in FIG. 15. The rotation plus flip is equivalent to a flip about a different axis.

Die stack from FIGS. 8 and 12 will result in same circuit stack orientation as shown in device 19 of FIG. 7 where memory 14 of one die is either at the top or bottom of logic 12 of another die. Same circuit stack orientation can be achieved in FIGS. 9 and 13 if the reticle set is rotated 180 degrees before manufacturing die 10 in wafer 126 or die 146 in FIGS. 9 and 13, respectively. Manufacturing die 10 with a rotated reticle set will create another wafer or die set in addition to the wafer or set for die 10 with original reticle set. However, manufacturing cost is still reduced as a new reticle set is not required. One advantage of this procedure is that the notches of the bonded wafers in FIG. 9 are aligned. This advantage does not apply to the die on wafer situation illustrated in FIG. 13.

Alternate embodiments may use die 10 which vary by a few mask layers, for example, some embodiments of die 10 may vary by one or more metal interconnect layers (see e.g. interconnect layer 15 in FIG. 7). Note that die 10 in FIGS. 1-6 also has an interconnect layer 15 (not shown). Such embodiments still retain the cost and ease of manufacturing advantage of using most of the same masks for forming a plurality of die used in a three dimensional stack of die. However, by varying the stacked die 10 by one or a few layers, additional functionality may be obtained for a small cost in masks and manufacturing complexity. Also, since devices 17 and 19 (see FIGS. 6 and 7) are made from a plurality of die 10, devices 17 and 19 can be manufactured and tested with little additional cost over the manufacturing and testing of die 10 itself. Also, in some embodiments, interconnect 20 in die 10 may comprise programmable circuits, such as, for example, a programmable fuse, which may be used to selectively determine the additional functionality for that particular die 10. Other die 10 may be programmable to select different functionality. In this manner, the top die 10 and the bottom die 10 may be programmed to have different functionality. Note that the interconnect layer 15 in FIG. 7 has been illustrated to show that one or more layers of interior 32 may be varied between the top die 10 and the bottom die 10 in a die stack. Alternate embodiments may vary by one or more additional layers in interior 32 (e.g. by using different diffusion masks, by using different etch masks, etc.).

Figure 16:
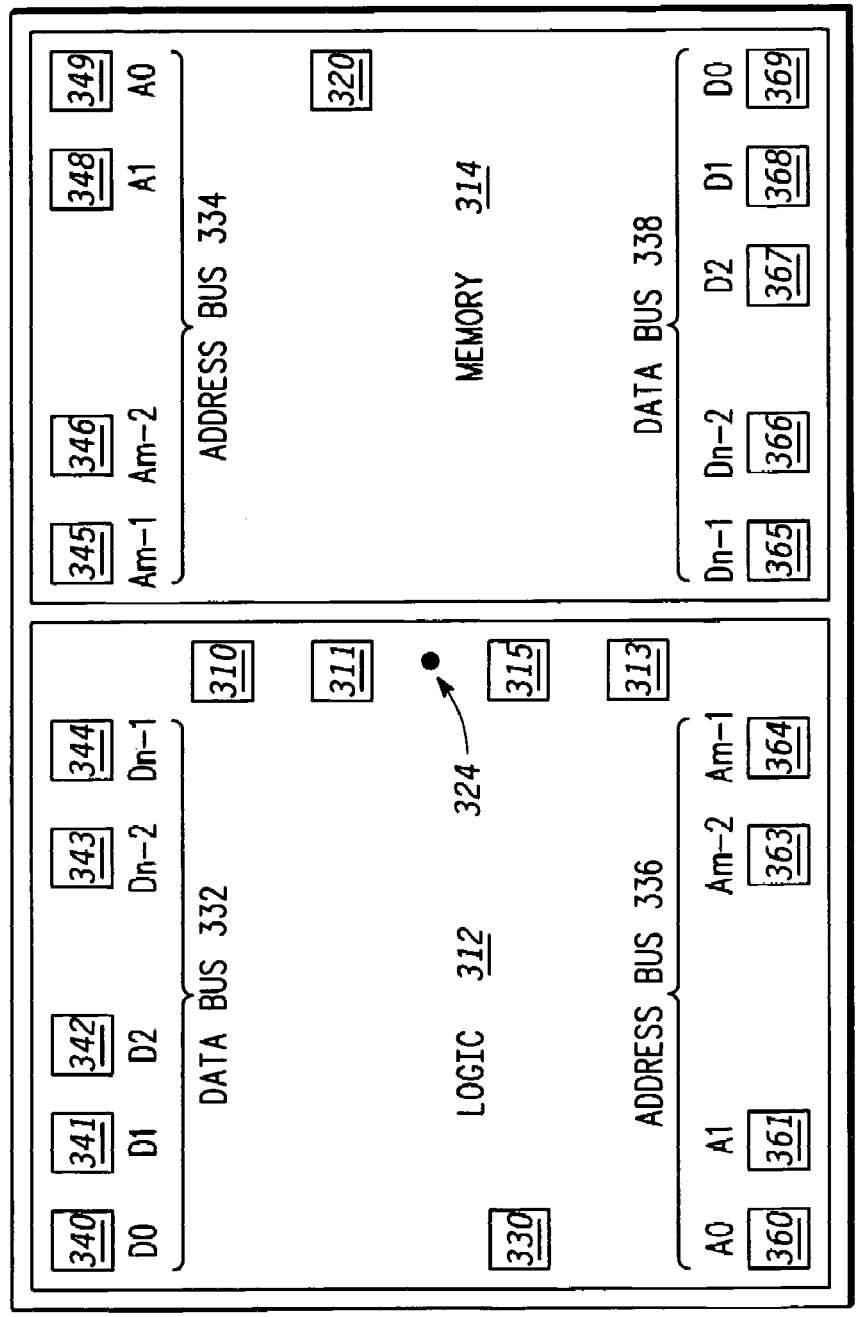
FIG. 16 illustrates, in block diagram form, a top view of an integrated circuit die with rotational reciprocal design symmetry in accordance with one embodiment of the present invention.

Another embodiment of the present invention is illustrated in FIG. 16 which shows, in block diagram form, a die 300 which has a rotational reciprocal design symmetry. The circuit design as well as the connective pad layout combine to provide the reciprocal design symmetry. Die 300 has a logic portion 312 and a memory portion 314. The logic portion 312 of die 300 has a data bus 332 with pads 340-344 which represent connections for data bus line functions D0, D1, D2, Dn-2 and Dn-1, respectively. The logic portion also has an address bus 336 with pads 360, 361, 363, and 364 which represent connections for address bus line functions A0, A1, Am-2, and Am-1, respectively. The memory portion 314 of die 300 has a data bus 338 with pads 365-369 which represent connections for data bus line functions Dn-1, Dn-2, D2, D1, and D0, respectively. The memory portion also has an address bus 334 with pads 345, 346, 348, and 349 which represent address bus line functions Am-1, Am-2, A1, and A0, respectively. The die 300 also has pads 310, 311, 313, 315, 320 and 330 which can be power, ground, and various additional logic and memory connections. It is understood that die 300 can have additional pads which are not illustrated here.

Figure 17:
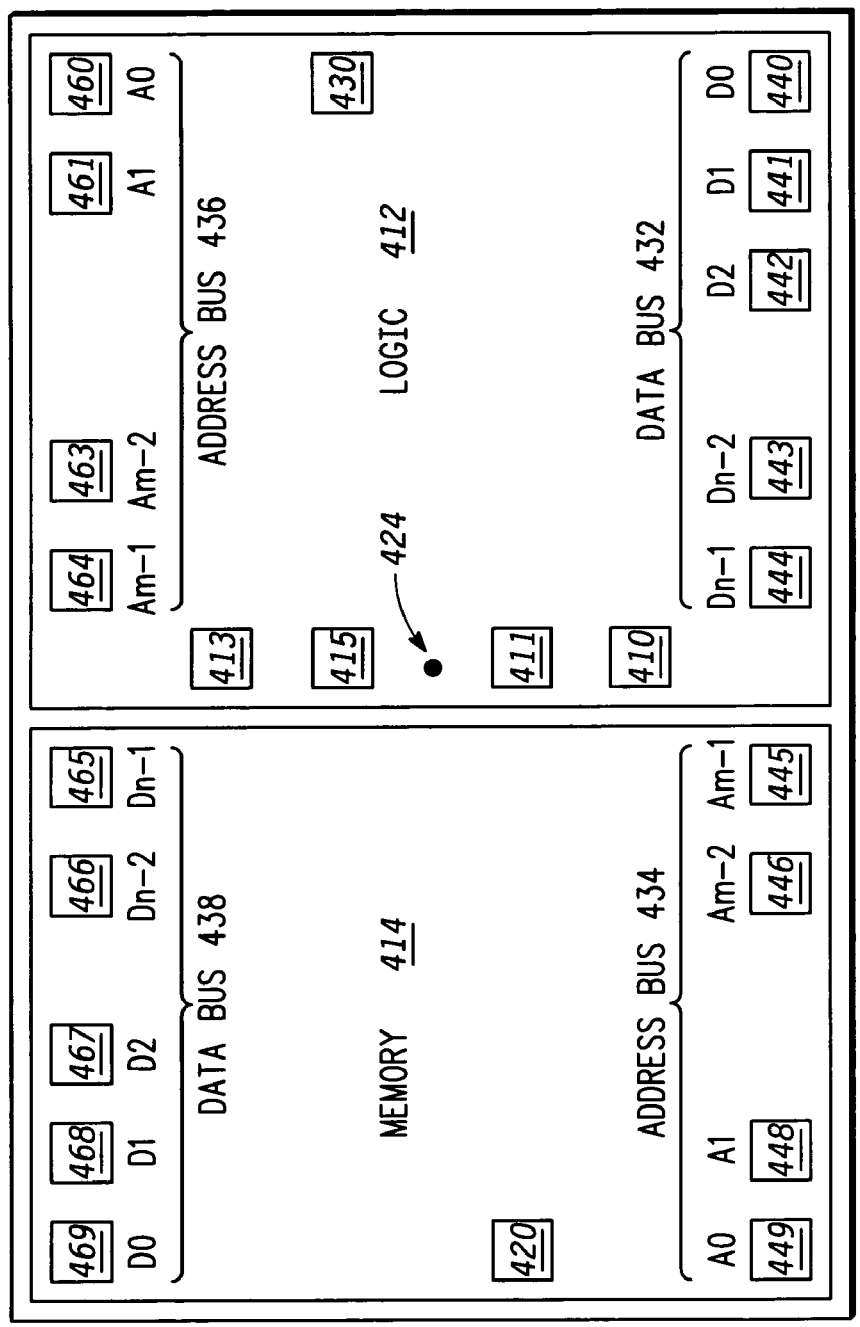
FIG. 17 illustrates, in block diagram form, a top view of an integrated circuit die with rotational reciprocal design symmetry in a reciprocal orientation relative to the die in FIG. 16 in accordance with one embodiment of the present invention.

FIG. 17 shows die 400 which has reciprocal design symmetry with respect to die 300. Furthermore, die 400 has been rotated about the vertical axis 424 so that it is in a reciprocal orientation to die 300. Die 400 has a logic portion 412 and a memory portion 414. The logic portion 412 of die 400 has a data bus 432 with pads 440-444 which represent connections for data bus line functions D0, D1, D2, Dn-2 and Dn-1, respectively. The logic portion also has an address bus 436 with pads 460, 461, 463, and 464 which represent connections for address bus line functions A0, A1, Am-2, and Am-1, respectively. The memory portion 414 of die 400 has a data bus 438 with pads 465-469 which represent connections for data bus line functions Dn-1, Dn-2, D2, D1, and D0, respectively. The memory portion also has an address bus 434 with pads 445, 446, 448, and 449 which represent address bus line functions Am-1, Am-2, A1, and A0, respectively. The die 400 also has pads 410, 411, 413, 415, 420 and 430 which can be power, ground, and various additional logic and memory connections. It is understood that die 400 can have additional pads which are not illustrated here.

If die 400 is stacked on top of die 300, the memory portion 414 of the die 400 overlies at least a portion of the logic portion 312 of die 300. Furthermore, the data bus 438 of the die 400 memory 414 overlies the data bus 332 of the die 300 logic 312. In the present embodiment, die 400 has a plurality of pads on the back which have the same layout as the pads on the face of die 400 (i.e, the pads 410, 411, 413, 415, 420, 430 and the pads of data bus 432, address bus 434, address bus 436 and data bus 438). Further, each pad on the back of die 400 which directly underlies one of the pads on the face of die 400 is electrically coupled to the overlying pad. Then when the back pads of die 400 are connected to the pads of the underlying die 300, the data bus 438 of the die 400 memory 414 is connected to the data bus 332 of the die 300 logic 312 with pads 469-465 connected to pads 340-344, respectively. Further, the address bus 434 of the die 400 memory 414 is connected to the address bus 336 of die 300 with pads 449, 448, 446, and 445 connected to pads 360, 361, 363, and 364, respectively. Thus the appropriate connections are made to complete the address bus and the data bus between the memory 414 in the top die and the logic 312 in the bottom die. Furthermore, the logic 412 of top die 400 overlies as least a portion of the memory 314 of the bottom die 300. When the back pads of die 400 are connected to the pads of the underlying die 300, the address bus 436 of the logic 412 of top die 400 is connected to the address bus 334 of the memory 314 of the bottom die 300 by the connection of pads 464, 463, 461, and 460 to 345, 346, 348, and 349, respectively. Further, the data bus 432 of die 400 logic 412 is connected to the data bus 338 of the die 300 memory 314 by the connection of pads 444-440 to pads 365-369 respectively. Thus the appropriate connections are made to complete the address bus and the data bus between the logic 412 in the top die and the memory 314 in the bottom die. Additionally, the pads 413, 415, 411, and 410 are connected to pads 310, 311, 315, and 313, respectively, pad 430 is connected to pad 320, and pad 420 is connected to pad 330 to complete additional circuit or interconnect functions. In this embodiment, die 300 and die 400 have rotational reciprocal design symmetry; however, they do not have flip reciprocal design symmetry.

Figure 18:
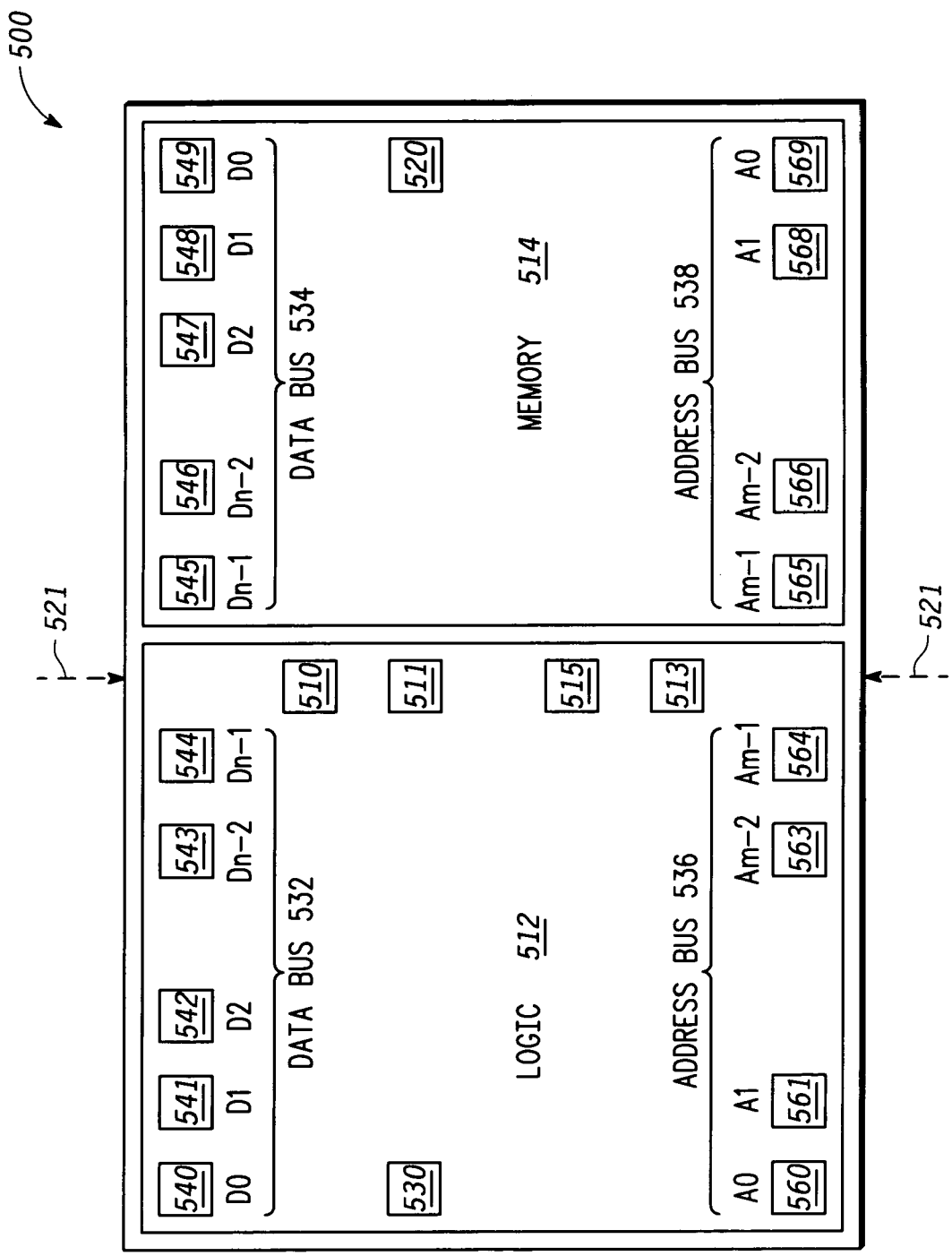
FIG. 18 illustrates, in block diagram form, a top view of an integrated circuit die with flip reciprocal design symmetry in accordance with one embodiment of the present invention.

Yet another embodiment of the present invention is illustrated in FIG. 18 which shows, in block diagram form, a die 500 which has a flip reciprocal design symmetry. The circuit design as well as the connective pad layout combine to provide the reciprocal design symmetry. Die 500 has a logic portion 512 and a memory portion 514. The logic portion 512 of die 500 has a data bus 532 with pads 540-544 which represent connections for data bus line functions D0, D1, D2, Dn-2 and Dn-1, respectively. The logic portion also has an address bus 536 with pads 560, 561, 563, and 564 which represent connections for address bus line functions A0, A1, Am-2, and Am-1, respectively. The memory portion 514 of die 500 has a data bus 534 with pads 545-549 which represent connections for data bus line functions Dn-1, Dn-2, D2, D1, and D0, respectively. The memory portion also has an address bus 538 with pads 565, 566, 568, and 569 which represent address bus line functions Am-1, Am-2, A1, and A0, respectively. The die 500 also has pads 510, 511, 513, 515, 520 and 530 which can be power, ground, and various additional logic and memory connections. It is understood that die 500 can have additional pads which are not illustrated here.

Figure 19:
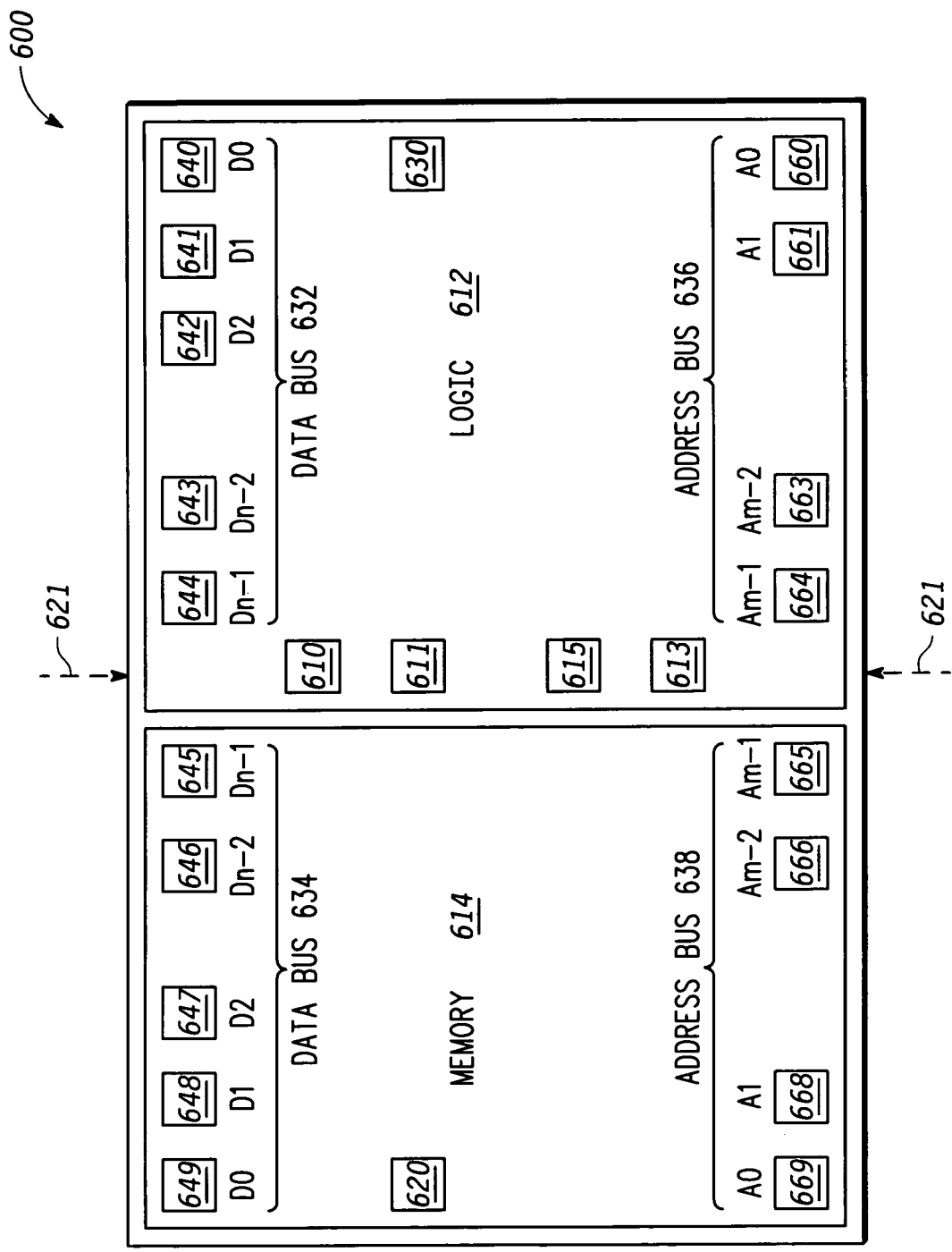
FIG. 19 illustrates, in block diagram form, a top down view of a cross-section of an integrated circuit die with flip reciprocal design symmetry in a reciprocal orientation relative to the die in FIG. 18 in accordance with one embodiment of the present invention.

FIG. 19 shows die 600 which has reciprocal design symmetry with respect to die 500. Furthermore, die 600 has been flipped about the horizontal axis 621 so that it is in a reciprocal orientation to die 500. The view of die 600 shown in FIG. 19 is a top down view of a cross section through what is the lower portion of die 600 following flipping the die into the reciprocal orientation. Die 600 has a logic portion 612 and a memory portion 614. The logic portion 612 of die 600 has a data bus 632 with pads 640-644 which represent connections for data bus line functions D0, D1, D2, Dn-2 and Dn-1, respectively. The logic portion also has an address bus 636 with pads 660, 661, 663, and 664 which represent connections for address bus line functions A0, A1, Am-2, and Am-1, respectively. The memory portion 614 of die 600 has a data bus 634 with pads 649-645 which represent connections for data bus line functions D0, D1, D2, Dn-2, and Dn-1, respectively. The memory portion also has an address bus 638 with pads 669, 668, 666, and 665 which represent address bus line functions A0, A1, Am-2, and Am-1, respectively. The die 600 also has pads 610, 611, 613, 615, 620 and 630 which can be power, ground, and various additional logic and memory connections. It is understood that die 600 can have additional pads which are not illustrated here.

If die 600 is stacked on top of die 500, the memory portion 614 of the die 600 overlies at least a portion of the logic portion 512 of die 500. Furthermore, the data bus 634 of the die 600 memory 614 overlies the data bus 532 of the die 500 logic 512. Then when the pads on what is the lower surface of die 600 following the flip are connected to the pads of the underlying die 500, the data bus 634 of the die 600 memory 614 is connected to the data bus 532 of the die 500 logic 512 with pads 649-645 connected to pads 540-544, respectively. Further, the address bus 638 of the die 600 memory 614 is connected to the address bus 536 of die 500 with pads 669, 668, 666, and 665 connected to pads 560, 561, 563, and 564, respectively. Thus the appropriate connections are made to complete the address bus and the data bus between the memory 614 in the top die and the logic 512 in the bottom die. Furthermore, the logic 612 of top die 600 overlies as least a portion of the memory 514 of the bottom die 500. When the pads of die 600 are connected to the pads of the underlying die 500, the address bus 636 of the logic 612 of top die 600 is connected to the address bus 538 of the memory 514 of the bottom die 500 by the connection of pads 664, 663, 661, and 660 to 565, 566, 568, and 569, respectively. Further, the data bus 632 of die 600 logic 612 is connected to the data bus 534 of the die 500 memory 514 by the connection of pads 644-640 to pads 545-549 respectively. Thus the appropriate connections are made to complete the address bus and the data bus between the logic 612 in the top die and the memory 514 in the bottom die. Additionally, the pads 610, 611, 613, and 615 are connected to pads 510, 511, 513, and 515 respectively, pad 630 is connected to pad 520, and pad 620 is connected to pad 530 to complete additional circuit or interconnect functions. Note that some of the circuits of either die 500 or die 600 or both may have external connections provided as is known in the art, for example by the use of appropriate through via connections. In this embodiment, die 500 and die 600 have flip reciprocal design symmetry; however, they do not have rotational reciprocal design symmetry.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor comprising:
   a first layer of circuitry having a predetermined circuit layout for implementing predetermined functions and having a reciprocal design symmetry about a first axis;
   a first plurality of contact pads overlying the first layer of circuitry, at least a portion of the first plurality of contact pads making electrical connection to the first layer of circuitry;
   a second plurality of contact pads in electrical contact with at least a portion of the first plurality of contact pads; and
   a second layer of circuitry having a reciprocal circuit layout of the predetermined circuit layout of the first layer of circuitry overlying the first layer of circuitry in reciprocal orientation, the second layer of circuitry making electrical connection to at least a portion of the second plurality of contact pads,
   wherein the second layer of circuitry has the reciprocal orientation of the reciprocal circuit layout by rotating the reciprocal circuit layout about a second axis and overlaying a resulting rotated second layer of circuitry and the second plurality of contact pads onto the first plurality of contact pads.

2. A semiconductor as in claim 1 wherein the second layer of circuitry has the reciprocal orientation by both flipping the reciprocal circuit layout in addition to rotating the reciprocal circuit layout.

3. A semiconductor as in claim 1 wherein the first layer of circuitry and the first plurality of contact pads are formed using a first mask set, wherein the second layer of layer of circuitry and the second plurality of contact pads are formed using a second mask set, and wherein the first mask set and the second mask set differ by no more than four mask reticles.

4. A semiconductor as in claim 1 further comprising:
a package around the semiconductor to form a single packaged semiconductor chip having multiple die.

5. A semiconductor as in claim 1 wherein the first layer of circuitry comprises logic circuitry and the second layer of circuitry comprises memory circuitry.

6. A semiconductor as in claim 5 wherein a bus signal in the logic circuitry is coupled to a first one of the first plurality of contact pads, wherein a bus signal in the memory circuitry is coupled to a first one of the second plurality of contact pads, wherein the first one of the second plurality of contact pads overlies the first one of the second plurality of contact pads and causes electrical connection between the bus signal in the logic circuitry and the bus signal in the memory circuitry.

7. A semiconductor comprising:
a first layer of circuitry having a predetermined circuit layout for implementing predetermined functions and having a reciprocal design symmetry about a first axis;
a first plurality of contact pads overlying the first layer of circuitry, at least a portion of the first plurality of contact pads being electrically coupled to the first layer of circuitry;
a second plurality of contact pads coupled to at least a portion of the first plurality of contact pads; and
a second layer of circuitry having a reciprocal circuit layout of the predetermined circuit layout of the first layer of circuitry overlying the first layer of circuitry in reciprocal orientation, the second layer of circuitry coupled to at least a portion of the second plurality of contact pads,
wherein the second layer of circuitry has the reciprocal orientation of the reciprocal circuit layout by rotating the reciprocal circuit layout about a second axis and overlaying a resulting rotated second layer of circuitry and the second plurality of contact pads onto the first plurality of contact pads.

8. A semiconductor as in claim 7 wherein the second layer of circuitry has the reciprocal orientation by both flipping the reciprocal circuit layout in addition to rotating the reciprocal circuit layout.

9. A semiconductor as in claim 7 wherein the first layer of circuitry and the first plurality of contact pads are formed using a first mask set, wherein the second layer of layer of circuitry and the second plurality of contact pads are formed using a second mask set, and wherein the first mask set and the second mask set differ by no more than four mask reticles.

10. A semiconductor as in claim 7 further comprising:
a package for the semiconductor.

11. A semiconductor as in claim 7 wherein the first layer of circuitry comprises logic circuitry and the second layer of circuitry comprises memory circuitry.

12. A semiconductor as in claim 11 wherein a bus signal in the logic circuitry is coupled to a first one of the first plurality of contact pads, wherein a bus signal in the memory circuitry is coupled to a first one of the second plurality of contact pads, wherein the first one of the second plurality of contact pads overlies the first one of the second plurality of contact pads and causes electrical coupling between the bus signal in the logic circuitry and the bus signal in the memory circuitry.

13. A semiconductor as in claim 7 wherein the first axis and the second axis are a same axis.

14. A method for providing a semiconductor, the method comprising:
providing a first layer of circuitry having a predetermined circuit layout for implementing predetermined functions and having a reciprocal design symmetry about a first axis;
providing a first plurality of contact pads overlying the first layer of circuitry, at least a portion of the first plurality of contact pads being coupled to the first layer of circuitry;
providing a second plurality of contact pads coupled to at least a portion of the first plurality of contact pads; and
providing a second layer of circuitry having a reciprocal circuit layout of the predetermined circuit layout of the first layer of circuitry overlying the first layer of circuitry in reciprocal orientation, the second layer of circuitry coupled to at least a portion of the second plurality of contact pads,
wherein the second layer of circuitry has the reciprocal orientation of the reciprocal circuit layout by rotating the reciprocal circuit layout about a second axis and overlaying a resulting rotated second layer of circuitry and the second plurality of contact pads onto the first plurality of contact pads.

15. A method as in claim 14 wherein the second layer of circuitry has the reciprocal orientation by both flipping the reciprocal circuit layout in addition to rotating the reciprocal circuit layout.

16. A method as in claim 14 wherein the first layer of circuitry and the first plurality of contact pads are formed using a first mask set, wherein the second layer of layer of circuitry and the second plurality of contact pads are formed using a second mask set, and wherein the first mask set and the second mask set differ by no more than four mask reticles.

17. A method as in claim 14 further comprising:
providing the semiconductor in a package.

18. A method as in claim 14 wherein the first layer of circuitry comprises logic circuitry and the second layer of circuitry comprises memory circuitry.

19. A method as in claim 18 wherein a bus signal in the logic circuitry is coupled to a first one of the first plurality of contact pads, wherein a bus signal in the memory circuitry is coupled to a first one of the second plurality of contact pads, wherein the first one of the second plurality of contact pads overlies the first one of the second plurality of contact pads and allows electrical coupling between the bus signal in the logic circuitry and the bus signal in the memory circuitry.

20. A method as in claim 14 wherein the first axis and the second axis are a same axis.

* * * * *